United States Patent
Das

(10) Patent No.: US 11,764,785 B2
(45) Date of Patent: *Sep. 19, 2023

(54) LEVEL SHIFTER CIRCUIT

(71) Applicant: TEXAS INSTRUMENTS INCORPORATED, Dallas, TX (US)

(72) Inventor: Abhijit Das, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/901,377

(22) Filed: Sep. 1, 2022

(65) Prior Publication Data

US 2023/0094930 A1 Mar. 30, 2023

Related U.S. Application Data

(63) Continuation of application No. 17/491,173, filed on Sep. 30, 2021, now Pat. No. 11,437,997.

(51) Int. Cl.
*H03K 19/0185* (2006.01)
*H03K 3/037* (2006.01)

(52) U.S. Cl.
CPC ..... *H03K 19/018528* (2013.01); *H03K 3/037* (2013.01); *H03K 19/018521* (2013.01)

(58) Field of Classification Search
CPC ....... H03K 19/0185; H03K 19/018507; H03K 19/018514–018528
See application file for complete search history.

(56) References Cited

U.S. PATENT DOCUMENTS

| | | | |
|---|---|---|---|
| 7,884,645 B2 * | 2/2011 | Chen | H03K 19/018528 327/333 |
| 7,994,819 B2 | 8/2011 | Aj-Shuoukh et al. | |
| 8,643,425 B2 | 2/2014 | Chaudhry et al. | |
| 10,122,362 B2 | 11/2018 | Cascio et al. | |
| 11,437,997 B1 * | 9/2022 | Das | H03K 3/356165 |

\* cited by examiner

*Primary Examiner* — Patrick O Neill

(74) *Attorney, Agent, or Firm* — Carl G. Peterson; Frank D. Cimino

(57) ABSTRACT

A level shifter circuit is provided. In some examples, the level shifter circuit includes a first set of transistors and a second set of transistors coupled between first and second power supply nodes. The control terminals of the first and second lower transistors are coupled to an input node. The level shifter circuit also includes a third set of transistors and a fourth set of transistors coupled between first and third power supply nodes. A control terminal of a third lower transistor is coupled to a second intermediate node, and a control terminal of a fourth lower transistor is coupled to a first intermediate node. Control terminals of the first upper transistor and the fourth upper transistor are coupled to a third intermediate node. Control terminals of the second upper transistor and the third upper transistor are coupled to a fourth intermediate node.

20 Claims, 5 Drawing Sheets

LEVEL SHIFTER CIRCUIT

This application is a continuation of U.S. patent application Ser. No. 17/491,173, filed Sep. 30, 2021, scheduled to issue as U.S. Pat. No. 11,437,997, on Sep. 6, 2022, which is hereby incorporated by reference herein in its entirety.

BACKGROUND

A level shifter circuit can convert a signal in a first voltage domain to a corresponding signal in a second voltage domain. For example, a microcontroller may generate control signals for the high-side switch and the low-side switch in a half bridge circuit. The microcontroller may generate signals in a first voltage domain (e.g., zero to 1.8 volts), and the low-side switch may accept a control signal in the first voltage domain. However, the high-side switch may require a control signal in a second voltage domain (e.g., 1.8 to 3.3 volts). A level shifter circuit can be coupled between the microcontroller and the high-side switch to convert a control signal generated by the microcontroller to the second voltage domain and deliver the converted signal to the control terminal of the high-side switch.

SUMMARY

In some examples, a level shifter circuit includes an input node, a first power supply node, a second power supply node, a third power supply node, and a first set of transistors coupled between the first and second power supply nodes. The first set of transistors includes a first lower transistor including a control terminal coupled to the input node, and the first set of transistors further includes a first upper transistor. The level shifter circuit also includes a first intermediate node between the first upper transistor and the first lower switch, an inverter gate circuit, and a second set of transistors coupled between the first and second power supply nodes. The second set of transistors includes a second lower transistor including a control terminal coupled to the input node via the inverter gate circuit, and the second set of transistors further includes a second upper transistor. In addition, the level shifter circuit includes a second intermediate node between the second upper transistor and the second lower switch. The level shifter circuit further includes a third set of transistors coupled between the first and third power supply nodes. The third set of transistors includes a third lower transistor including a control terminal coupled to the second intermediate node, and the third set of transistors further includes a third upper transistor. The level shifter circuit also includes a third intermediate node between the third upper transistor and the third lower transistor, and the first upper transistor includes a control terminal coupled to the third intermediate node. The level shifter circuit includes a fourth set of transistors coupled between the first and third power supply nodes, and the fourth set of transistors includes a fourth lower transistor including a control terminal coupled to the first intermediate node. The fourth set of transistors further includes a fourth upper transistor including a control terminal coupled to the third intermediate node. The level shifter circuit further includes a fourth intermediate node between the fourth upper transistor and the fourth lower transistor, the second upper transistor includes a control terminal coupled to the fourth intermediate node, and the third upper transistor includes a control terminal coupled to the fourth intermediate node.

In further examples, a method includes activating a first lower transistor of a first set of transistors to pull down a voltage level at a first intermediate node of the first set of transistors responsive to receiving a first voltage signal at an input node of the level shift circuit. The method also includes activating a fourth lower transistor of a fourth set of transistors to pull down a voltage level at a fourth intermediate node of the fourth set of transistors responsive to the voltage level at the first intermediate node being pulled down. In addition, the method includes activating a third upper transistor of a third set of transistors to pull up a voltage level at a third intermediate node of the third set of transistors responsive to the voltage level at the fourth intermediate node being pulled down. The method further includes activating a second lower transistor of a second set of transistors to pull down a voltage level at a second intermediate node of the second set of transistors responsive to receiving a second voltage signal at the input node of the level shift circuit. The method includes activating a third lower transistor of the third set of transistors to pull down the voltage level at the third intermediate node responsive to the voltage level at the second intermediate node being pulled down. The method also includes activating a fourth upper transistor of the fourth set of transistors to pull up the voltage level at the fourth intermediate node responsive to the voltage level at the third intermediate node being pulled down.

In yet further examples, a level shifter circuit includes an input node, an inverter gate circuit, and a first transistor including a first control terminal and a first conductive channel, where the first control terminal is coupled to the input node. The level shifter circuit also includes a second transistor including a second control terminal and a second conductive channel, where the second control terminal is coupled to the input node via the inverter gate circuit. In addition, the level shifter circuit includes a third transistor including a third control terminal and a third conductive channel. The third conductive channel is coupled between the second conductive channel and a first power supply node, and the second conductive channel is coupled between the third conductive channel and a second power supply node. The level shifter circuit further includes a fourth transistor including a fourth control terminal and a fourth conductive channel. The fourth conductive channel is coupled between the first conductive channel and the first power supply node, and the first conductive channel is coupled between the fourth conductive channel and the second power supply node. The level shifter circuit further includes a fifth transistor including a fifth control terminal and a fifth conductive channel. The fifth control terminal is coupled to the third control terminal, and the fifth conductive channel is coupled between the fourth control terminal and the first power supply node. The level shifter circuit also includes a sixth transistor including a sixth control terminal and a sixth conductive channel. The sixth control terminal is coupled to the fourth control terminal, and the sixth conductive channel is coupled between the third control terminal and the first power supply node. The level shifter circuit includes a seventh transistor including a seventh control terminal and a seventh conductive channel. The seventh control terminal is coupled to the second conductive channel and the third conductive channel, and the seventh conductive channel is coupled between the fifth conductive channel and a third power supply node. The level shifter circuit further includes an eighth transistor including an eighth control terminal and an eighth conductive channel, wherein the eighth control terminal is coupled to the first conductive channel and the fourth conductive channel, and wherein the eighth conductive channel is coupled between the sixth conductive channel and the third power supply node.

BRIEF DESCRIPTION OF THE DRAWINGS

Features of the present invention may be understood from the following detailed description and the accompanying drawings. In that regard.

DETAILED DESCRIPTION

Specific examples are described below in detail with reference to the accompanying figures. It is understood that these examples are not intended to be limiting, and unless otherwise noted, no feature is required for any particular example. Moreover, the formation of a first feature over or on a second feature in the description that follows may include examples in which the first and second features are formed in direct contact and examples in which additional features are formed between the first and second features, such that the first and second features are not in direct contact.

In general, a level shifter circuit communicates signals between two different voltage domains by increasing and/or decreasing the minimum and/or maximum voltage levels for the communicated signals. In a system operating at a high clock rate, the speed at which signals can be communicated by a level shifter circuit across voltage domains is important. In accordance with the techniques of this disclosure, a level shifter circuit may include one or more source-follower transistors that can quickly respond to changes in the voltage level at the input node of the level shifter circuit. In addition, the level shifter circuit may include one or more positive feedback loops to enable and reinforce fast switching of the output voltage of the level shifter circuit. Of course, these advantages are merely examples, and no advantage is required for any particular embodiment.

Figure 1:
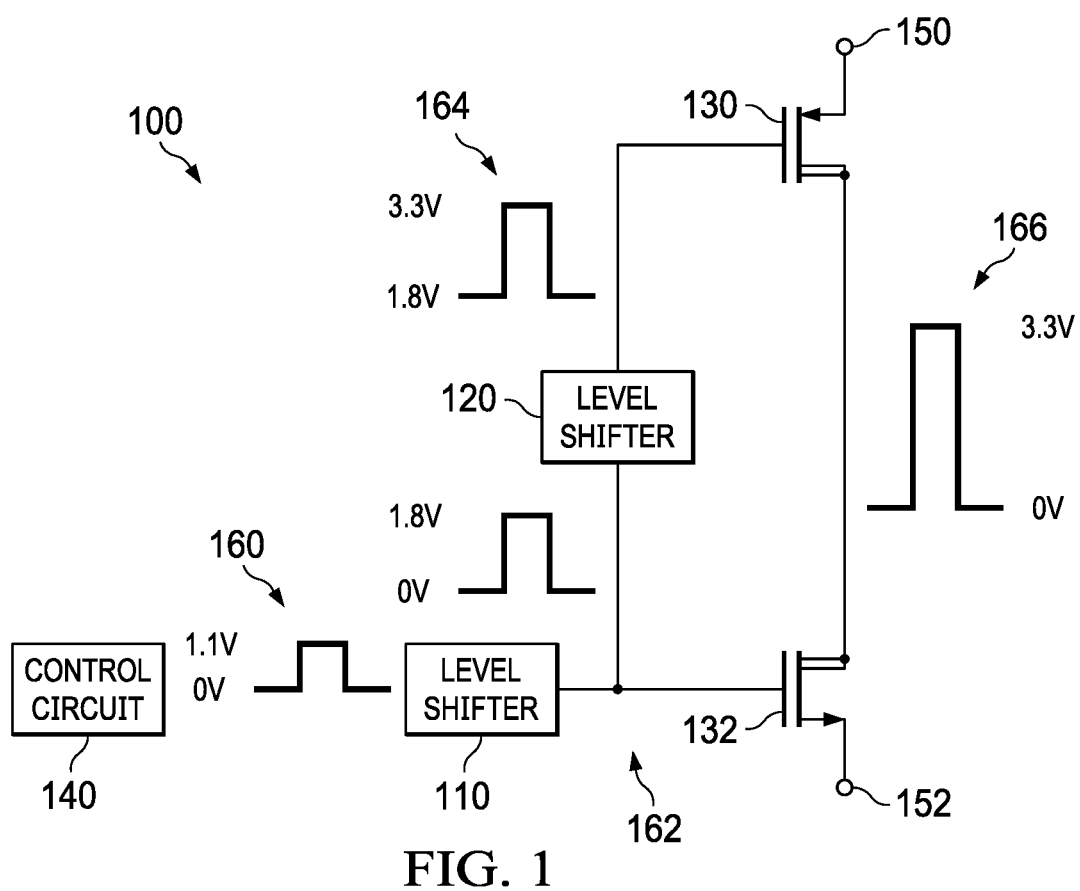
FIG. 1 is a conceptual block and circuit diagram of an example system including two level shifter circuits according to some aspects of the present disclosure.

Examples of level shifter circuits are described with reference to the figures below. In that regard, FIG. 1 is a conceptual block and circuit diagram of an example system 100 including two level shifter circuits 110 and 120 according to some aspects of the present disclosure. System 100 also includes switches 130 and 132, control circuit 140, voltage supply nodes 150 and 152, and voltage domains 160, 162, 164, and 166. FIG. 1 depicts switches 130 and 132 arranged in a digital inverter circuit, but the level shifter circuits described herein can be used in other systems such as power electronics systems, analog systems, embedded systems, integrated circuits, motor drivers, communication systems, and/or any other electrical system.

In the example shown in FIG. 1, level shifter circuit 110 is configured to convert a signal generated by control circuit 140 from voltage domain 160 to a corresponding signal in voltage domain 162. Control circuit 140 includes core circuitry and/or digital supply circuitry. Control circuit 140 may be configured to operate in voltage domain 160 by, for example, generating control signals for switches 130 and 132. Voltage domain 162 includes the control terminal of low-side switch 132, while the conductive channel of switch 132 is coupled between voltage domain 166 and voltage supply node 152. Level shifter circuit 120 is configured to convert a signal in voltage domain 162 to a corresponding signal in voltage domain 164. Voltage domain 164 includes the control terminal of high-side switch 130, while the conductive channel of switch 130 is coupled between voltage supply node 150 and voltage domain 166.

In the example of FIG. 1, switch 130 is depicted as a P-type drain-extended metal-oxide-semiconductor (DEMOS) device, and switch 132 is depicted as an N-type DEMOS device. The drain on a DEMOS device may have a distinct doping profile that results in an elongated drain. A DEMOS device may be capable of handling a larger voltage drop from drain to source, from drain to gate, or from drain to bulk (e.g., 3.3 volts), as compared to the maximum allowable voltage drop from gate to source or from gate to bulk for the DEMOS device and for other comparable devices in the same technology node (e.g., 1.8 volts). Using the example voltage ranges shown in FIG. 1, the maximum gate-to-source voltage drop experienced by switches 130 and 132 will be 1.5 volts and 1.8 volts, respectively. The maximum gate-to-drain and drain-to-source voltage drop experienced by switches 130 and 132 will be 3.3 volts, in the example of FIG. 1. In some implementations, it is possible to avoid using DEMOS devices by adding cascoded transistors to reduce the stress on the drain terminal of the MOS device.

In some examples, all of the components shown in FIG. 1 may be integrated into a single semiconductor die. In addition, the power supplies coupled to nodes 150 and 152 may also be integrated into the single semiconductor die. Alternatively, the components shown in FIG. 1 may be integrated across multiple semiconductor dies. Additionally or alternatively, some or all of the components shown in FIG. 1 may also be implemented as discrete components on a circuit board.

Figure 2:
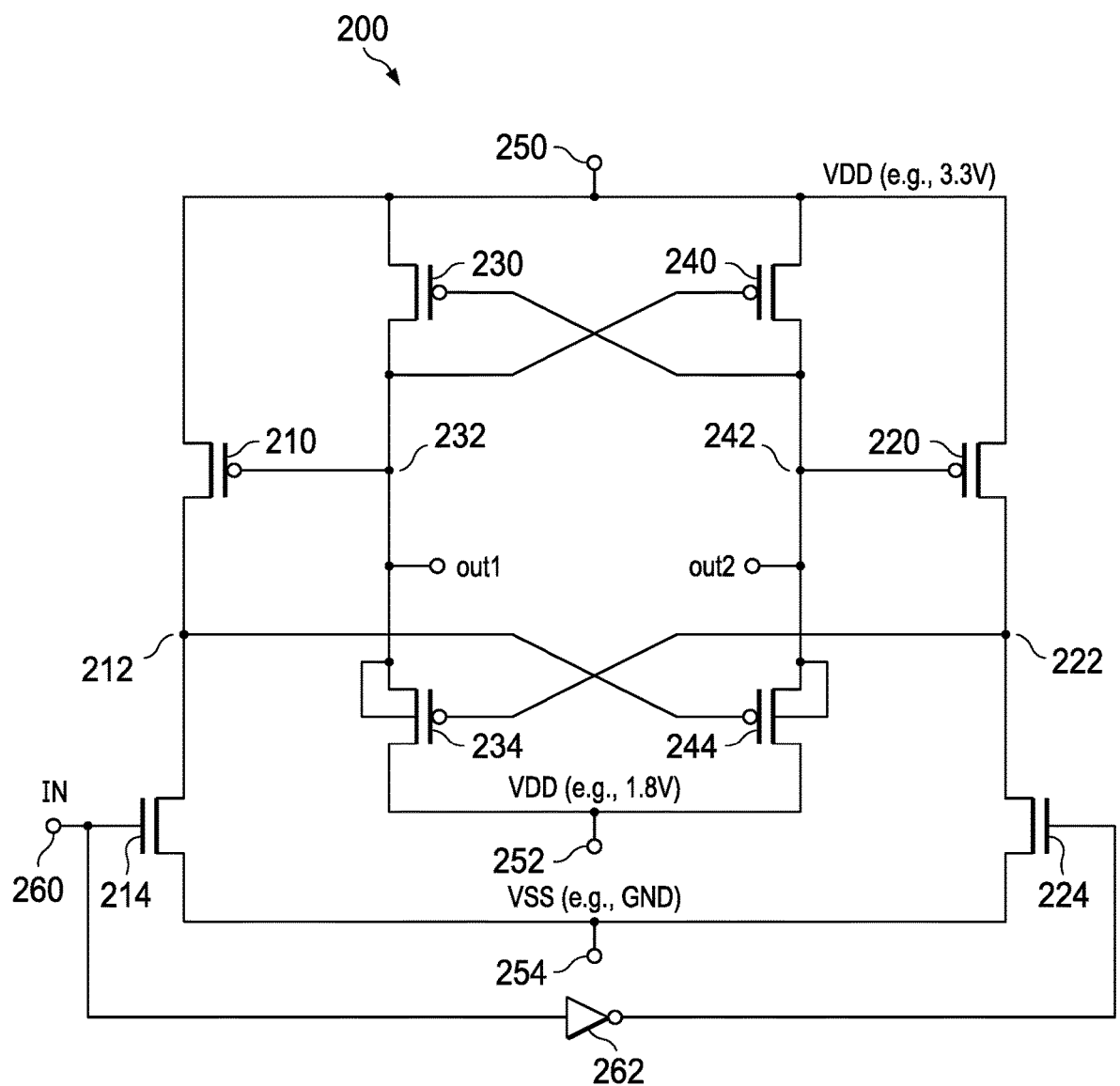
FIGS. 2 and 3 are circuit diagrams of level shifter circuits including two source follower transistors according to some aspects of the present disclosure.
Figure 3:
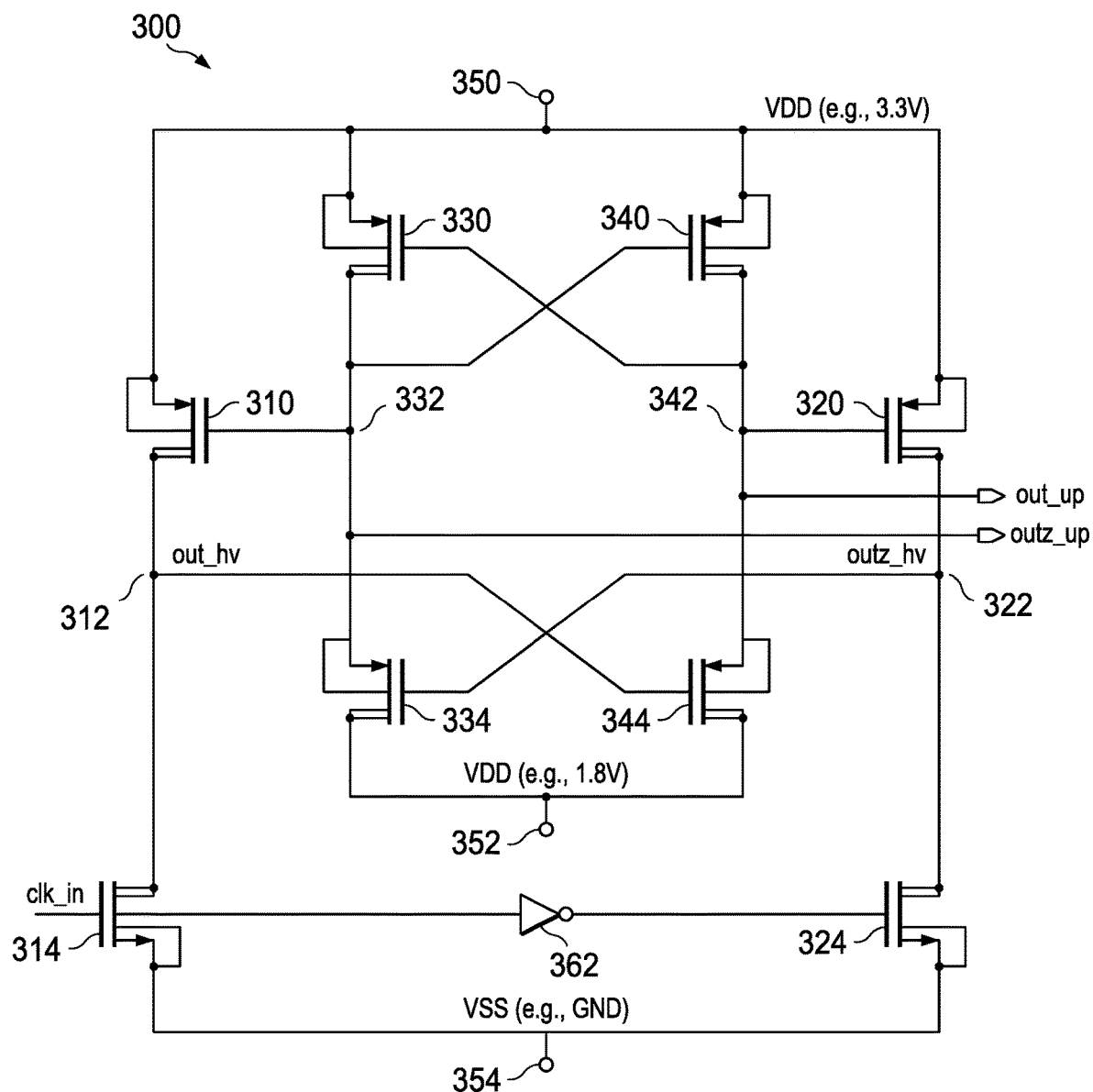

FIGS. 2 and 3 are circuit diagrams of level shifter circuits 200 and 300 including two source follower devices 234, 244, 334, and 344 according to some aspects of the present disclosure. In the example shown in FIG. 2, level shifter circuit 200 includes transistors 210, 214, 220, 224, 230, 234, 240, and 244, nodes 212, 222, 232, and 242, power supply nodes 250, 252, and 254, and inverter gate circuit 262. One or more of the power supplies that can be coupled to power supply nodes 250, 252, and 254 may be external to level shifter circuit 200, external to one or more dies on which level shifter circuit 200 is integrated, and/or external to the device of which level shifter circuit 200 is a component. Additionally or alternatively, one or more of the power supplies may be part of level shifter circuit 200, integrated with level shifter circuit 200 on one or more dies, and/or part of the same device as level shifter circuit 200.

In some examples, transistors 210, 214, 220, 224, 230, 234, 240, and 244 may be integrated into a single semiconductor die. The power supplies coupled to nodes 250, 252, and 254 may also be integrated into the single semiconductor die. Alternatively, transistors 210, 214, 220, 224, 230, 234, 240, and 244 may be integrated across multiple semiconductor dies. Additionally or alternatively, some or all of transistors 210, 214, 220, 224, 230, 234, 240, and 244 may be implemented as discrete components on a circuit board.

In some examples, input node 260 is coupled to an input circuit, and nodes 232 and/or 242 are coupled to an output circuit with a different voltage range than the input circuit. Using the voltage ranges shown in FIG. 1 as an example, input node 260 may experience voltage levels from zero to 1.8 volts, and nodes 232 and 242 may experience voltage levels from 1.8 volts to 3.3 volts. Thus, the highest voltage level at input node 260 (e.g., 1.8 volts) may be lower than the voltage level of the power supply coupled to node 250 (e.g., 3.3 volts). For this reason, the maximum gate-to-source voltage for transistors 214 and 224 (e.g., 1.8 volts) may be lower than the maximum drain-to-source voltage for transistors 214 and 224 (e.g., 3.3 volts). Transistors 214 and 224 may be implemented as DEMOS transistors to tolerate this relatively high drain-to-source voltage. Transistors 210 and 220 may also be implemented as DEMOS transistors, as described below.

Any of the transistors described in this disclosure, including transistors 210, 214, 220, 224, 230, 234, 240, and 244, may be implemented as one or more transistors such as, but not limited to, any type of field-effect transistor (FET) such as a MOSFET, a bipolar junction transistor (BJT), an insulated-gate bipolar transistor (IGBT), a silicon carbide (SiC) based transistor, a gallium-nitride (GaN) based transistor, a silicon based transistor, or another voltage-controlled element. Each of the transistors may include n-type transistors, p-type transistors, or other analog devices such as diodes and/or thyristors.

Any of the transistors described in this disclosure, including transistors 210, 214, 220, 224, 230, 234, 240, and 244, may include one control terminal, two load terminals, and one conductive channel coupled between the load terminals. Any of the transistors may also include a bulk terminal or a body terminal. The conductivity of the conductive channel may depend on the voltage level at the control terminal relative to the voltage level at one of the load terminals. Gate terminals and base terminals are examples of control terminals. Source terminals, drain terminals, emitter terminals, and collector terminals are examples of load terminals. The conductive channel of a transistor may extend between the load terminals of that transistor. The term "load terminal" does not necessarily mean that an electrical load is attached to the load terminal of a transistor.

The conductive channels of each of transistors 210, 214, 220, and 224 may be exposed to the full voltage range spanning the voltage levels of the power supplies coupled to nodes 250 and 254. The conductive channels of each of transistors 230, 234, 240, and 244 may be exposed to the full voltage range spanning the voltage levels of the power supplies coupled to nodes 250 and 252. In examples in which the voltage range of nodes 250 and 254 exceeds the voltage range of nodes 250 and 252, each of transistors 210, 214, 220, and 224 may include a DEMOS transistor or use a cascoding technique to increase the effective voltage handling capacity of the design.

The arrangement of transistors 210, 214, 220, 224, 230, 234, 240, and 244 will now be described in terms of the connections of each terminal shown in FIG. 2. The control terminal of transistor 210 is coupled to node 232 such that the conductivity of transistor 210 is based on the voltage level at node 232 (e.g., relative to the voltage level at voltage supply node 250). The control terminal of transistor 210 is also coupled, via node 232, to the control terminal of transistor 240 and to the conductive channels of transistors 230 and 234. A first load terminal of transistor 210 (e.g., a drain terminal) is coupled to node 212, to the conductive channel of transistor 214, and to the control terminal of transistor 244. A second load terminal of transistor 210 (e.g., a source terminal) is coupled to voltage supply node 250. Thus, the conductive channel of transistor 210 is coupled between voltage supply node 250 and node 212, between voltage supply node 250 and the conductive channel of transistor 214, and between voltage supply node 250 and the control terminal of transistor 244.

The control terminal of transistor 214 is coupled to input node 260 such that the conductivity of transistor 214 is based on the voltage level at input node 260 (e.g., relative to the voltage level at voltage supply node 254). The control terminal of transistor 214 is also coupled, via inverter gate circuit 262, to the control terminal of transistor 224. A first load terminal of transistor 214 (e.g., a drain terminal) is coupled to node 212, to the conductive channel of transistor 210, and to the control terminal of transistor 244. A second load terminal of transistor 214 (e.g., a source terminal) is coupled to voltage supply node 254. Thus, the conductive channel of transistor 214 is coupled between node 212 and voltage supply node 254, between the conductive channel of transistor 210 and voltage supply node 254, and between the control terminal of transistor 244 and voltage supply node 254.

The control terminal of transistor 220 is coupled to node 242 such that the conductivity of transistor 220 is based on the voltage level at node 242 (e.g., relative to the voltage level at voltage supply node 250). The control terminal of transistor 220 is also coupled, via node 242, to the control terminal of transistor 230 and to the conductive channels of transistors 240 and 244. A first load terminal of transistor 220 (e.g., a drain terminal) is coupled to node 222, to the conductive channel of transistor 224, and to the control terminal of transistor 234. A second load terminal of transistor 220 (e.g., a source terminal) is coupled to voltage supply node 250. Thus, the conductive channel of transistor 220 is coupled between voltage supply node 250 and node 222, between voltage supply node 250 and the conductive channel of transistor 224, and between voltage supply node 250 and the control terminal of transistor 234.

The control terminal of transistor 224 is coupled to the output of inverter gate circuit 262 such that the conductivity of transistor 224 is based on the voltage level at the output of inverter gate circuit 262 (e.g., relative to the voltage level at voltage supply node 254). The control terminal of transistor 224 is also coupled, via inverter gate circuit 262, to input node 260 and to the control terminal of transistor 214. A first load terminal of transistor 224 (e.g., a drain terminal) is coupled to node 222, to the conductive channel of transistor 220, and to the control terminal of transistor 234. A second load terminal of transistor 224 (e.g., a source terminal) is coupled to voltage supply node 254. Thus, the conductive channel of transistor 224 is coupled between node 222 and voltage supply node 254, between the conductive channel of transistor 220 and voltage supply node 254, and between the control terminal of transistor 234 and voltage supply node 254.

The control terminal of transistor 230 is coupled to node 242 such that the conductivity of transistor 230 is based on the voltage level at node 242 (e.g., relative to the voltage level at node 250). The control terminal of transistor 230 is also coupled, via node 242, to the control terminal of transistor 220 and to the conductive channels of transistors 240 and 244. A first load terminal of transistor 230 (e.g., a drain terminal) is coupled to node 232, to the conductive channel of transistor 234, and to the control terminals of transistors 210 and 240. A second load terminal of transistor 230 (e.g., a source terminal) is coupled to voltage supply node 250. Thus, the conductive channel of transistor 230 is coupled between voltage supply node 250 and node 232, between voltage supply node 250 and the conductive channel of transistor 234, between voltage supply node 250 and the control terminal of transistor 210, and between voltage supply node 250 and the control terminal of transistor 240.

The control terminal of transistor 234 is coupled to node 222 such that the conductivity of transistor 234 is based on the voltage level at node 222 (e.g., relative to the voltage level at node 232). The control terminal of transistor 234 is also coupled, via node 222, to the conductive channels of transistors 220 and 224. A first load terminal of transistor 234 (e.g., a drain terminal) is coupled to voltage supply node 252. A second load terminal of transistor 234 (e.g., a source terminal) is coupled to node 232, to the conductive channel of transistor 230, and to the control terminals of transistors 210 and 240. Thus, the conductive channel of transistor 234 is coupled between node 232 and voltage supply node 252, between the conductive channel of transistor 230 and voltage supply node 252, between the control terminal of transistor 210 and voltage supply node 252, and between the control terminal of transistor 240 and voltage supply node 252.

The control terminal of transistor 240 is coupled to node 232 such that the conductivity of transistor 240 is based on the voltage level at node 232 (e.g., relative to the voltage level at node 250). The control terminal of transistor 240 is also coupled, via node 232, to the control terminal of transistor 210 and to the conductive channels of transistors 230 and 234. A first load terminal of transistor 240 (e.g., a drain terminal) is coupled to node 242, to the conductive channel of transistor 244, and to the control terminals of transistors 220 and 230. A second load terminal of transistor 240 (e.g., a source terminal) is coupled to voltage supply node 250. Thus, the conductive channel of transistor 240 is coupled between voltage supply node 250 and node 242, between voltage supply node 250 and the conductive channel of transistor 244, between voltage supply node 250 and the control terminal of transistor 220, and between voltage supply node 250 and the control terminal of transistor 230.

The control terminal of transistor 244 is coupled to node 212 such that the conductivity of transistor 244 is based on the voltage level at node 212 (e.g., relative to the voltage level at node 242). The control terminal of transistor 244 is also coupled, via node 212, to the conductive channels of transistors 210 and 214. A first load terminal of transistor 244 (e.g., a drain terminal) is coupled to voltage supply node 252. A second load terminal of transistor 244 (e.g., a source terminal) is coupled to node 242, to the conductive channel of transistor 240, and to the control terminals of transistors 220 and 230. Thus, the conductive channel of transistor 244 is coupled between node 242 and voltage supply node 252, between the conductive channel of transistor 240 and voltage supply node 252, between the control terminal of transistor 220 and voltage supply node 252, and between the control terminal of transistor 230 and voltage supply node 252.

As shown in FIG. 2, level shifter circuit 200 includes four sets of transistors, where each set of transistors extends between two power supply nodes. Each set of transistors may be referred to as a stack of switches or transistors, a string of switches or transistors, or a set of switches or transistors. The first set of transistors shown in FIG. 2 includes transistors 210 and 214 coupled in series between power supply nodes 250 and 254. The second set of transistors includes transistors 220 and 224 coupled in series between power supply nodes 250 and 254. The third set of transistors includes transistors 230 and 234 coupled in series between power supply nodes 250 and 252. The fourth set of transistors includes transistors 240 and 244 coupled in series between power supply nodes 250 and 252.

The first set of transistors includes nodes 232 and 260 as inputs because the control terminal of transistor 210 is coupled to node 232 and the control terminal of transistor 214 is coupled to input node 260. The first set of transistors also includes node 212 as an output because node 212 is coupled between the conductive channels of transistors 210 and 214. The second set of transistors includes nodes 242 and 260 as inputs and node 222 as an output. The control terminal of transistor 224 is coupled to input node 260 via inverter gate circuit 262, such that the control terminal of transistor 224 receives an inverted version of the signal received at the control terminal of transistor 214. The third set of transistors includes nodes 222 and 242 as inputs and node 232 as an output. The fourth set of transistors includes nodes 212 and 232 as inputs and node 242 as an output.

FIG. 2 depicts transistors 210, 220, 230, 234, 240, and 244 as PMOS transistors and depicts transistors 214 and 224 as NMOS transistors. Other combinations of NMOS and PMOS transistors are contemplated by this disclosure, and the depiction of a particular transistor as either an NMOS transistor or a PMOS transistor is not meant to be limiting for every implementation contemplated by this disclosure.

Transistors 234 and 244 may be referred to as "source-followers" because the voltage level at the source terminal of each of transistors 234 and 244 generally follows the voltage level at the gate terminal of the respective transistor. For example, a decrease in voltage at node 222 will activate transistor 234, pulling down the voltage level at node 232, which is coupled to the source terminal of transistor 234. Level shifter circuit 200 employs a positive feedback circuitry to speed up the operation. This structure has two positive feedback networks, one is composed of transistors 230 and 244, which can make a fast pull-up transition on nodes 232 and 242 based on input voltage at node 260. The second positive feedback is comprised of transistors 234, 244, 220 and 210. This second positive feedback helps to pull down nodes 232 and 242 faster. These two feedback mechanisms combine to allow a faster response from the level shifter for both rising and falling transitions. Thus, level shifter circuit 200 may communicate voltage changes at node 260 to nodes 232 and 242 more quickly than another level shifter that uses a cascode circuit.

The source terminals of transistors 210, 220, 230, and 240 are coupled to power supply node 250, and the source terminals of transistors 214 and 224 are coupled to power supply node 254. Power supply nodes 250, 252, and 254 may have low impedance when coupled to a respective power supply, so that the voltage level of the source terminals of transistors 210, 214, 220, 224, 230, and 240 are not called "source-followers" because the voltage level of power supply nodes 250 and 254 will not change substantially in response to a change in the voltage level of a control terminal of one of transistors 210, 214, 220, 224, 230, and 240.

FIG. 3 shows level shifter circuit 300, which includes transistors 310, 314, 320, 324, 330, 334, 340, and 344. In the example shown in FIG. 3, the bulk terminal of each of transistors 310, 314, 320, 324, 330, 334, 340, and 344 are connected to the source terminal of the respective transistor. For example, the bulk and source terminals of transistor 334 are coupled to node 332, to the conductive channel of transistor 330, and to the control terminals of transistors 310 and 340. The bulk and source terminals of transistor 344 are coupled to node 342, to the conductive channel of transistor 340, and to the control terminals of transistors 320 and 330. In addition, the bulk and source terminals of transistors 310, 320, 330, and 340 are coupled to power supply node 350, and the bulk and source terminals of transistors 314 and 324 are coupled to power supply node 354. Although FIG. 3 depicts bulk-source couplings, the bulk terminals of one or more of transistors 310, 314, 320, 324, 330, 334, 340, and 344 may instead be coupled to another terminal or another node, in some examples, or decoupled from other nodes.

Coupling the bulk and source terminals of a transistor may be useful in reducing the stress on the transistor. As an example, the bulk and source terminals of transistor 334 are coupled to node 332, which experiences a range of voltages bounded by power supply nodes 350 and 352. The gate terminal of transistor 334 is coupled to node 322, which experiences a range of voltages bounded by power supply nodes 350 and 354. In other words, the gate and source terminals of transistor 334 are exposed to different voltage ranges. In examples in which the voltage level of power supply node 354 is less than the voltage level of power supply node 352, the gate terminal of transistor 334 experiences a greater range of voltage levels than the source and bulk terminals of transistor 334. If the gate terminal of transistor 334 decreases towards the voltage level of power supply node 354, the conductive channel of transistor 334 will become activated and pull down the voltage level of the source terminal of transistor 334 towards the voltage level of power supply node 352. By coupling the bulk terminal of transistor 334 to the source terminal of transistor 334, the bulk terminal will also be pulled down as the voltage level of the source terminal decreases, thereby reducing the gate-to-bulk stress on transistor 334.

Using the example voltage ranges described with respect to level shifter circuit 120 shown in FIG. 1, the power supply coupled to node 350 may have a voltage level of 3.3 volts, the power supply coupled to node 352 may have a voltage level of 1.8 volts, and the power supply coupled to node 354 may have a voltage level of zero volts. Hypothetically, if the voltage level at node 322 goes to zero in an instant, the gate-to-source voltage of transistor 334 may be 3.3 volts. This gate-to-source voltage may exceed the voltage rating of transistor 334, which could cause damage to transistor 334. In reality, the gate voltage of transistor 334 will not decline from 3.3 volts to zero instantaneously. Instead, as the gate voltage decreases and the gate-to-source voltage increases, the conductive channel of transistor 334 will become activated, pulling down the bulk and source terminals of transistor 334, thereby keeping the gate-to-source voltage and bulk-to-gate voltage of transistor 334 at a much lower level than 3.3 volts.

Figure 4:
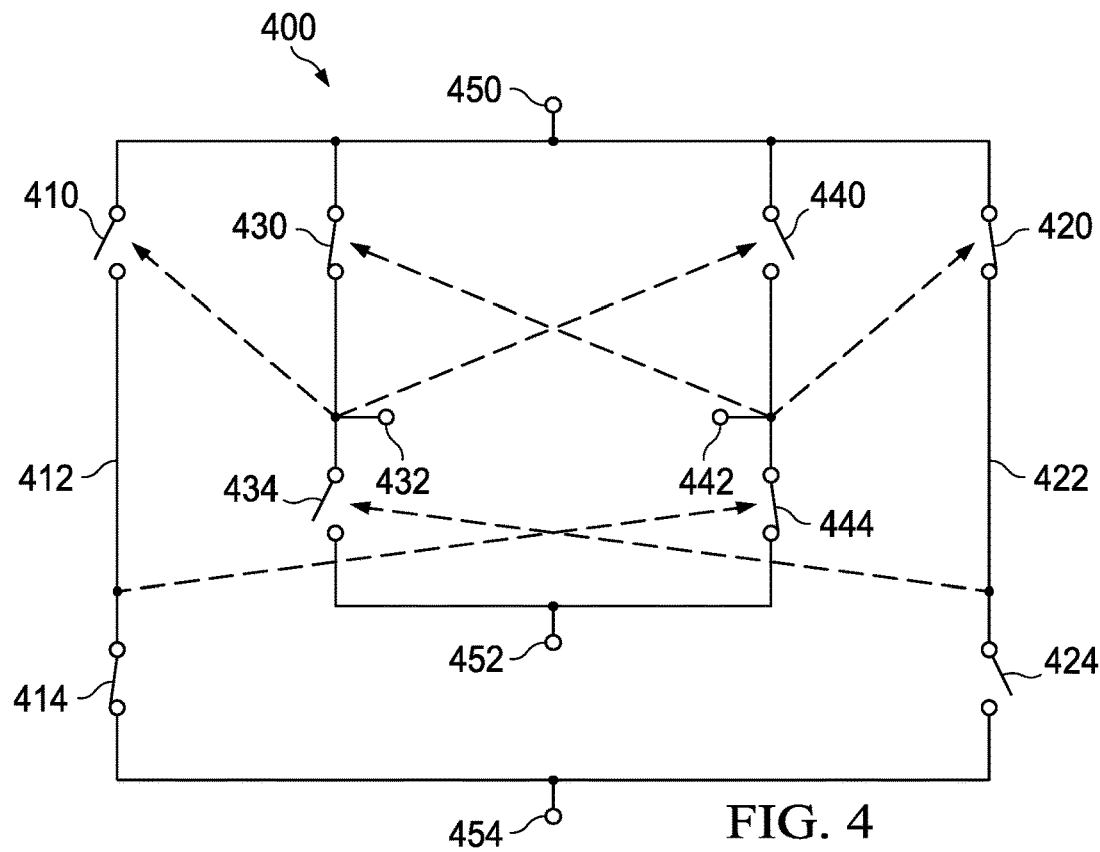
FIGS. 4 and 5 are circuit diagrams of level shifter circuits in two different states according to some aspects of the present disclosure.
Figure 5:
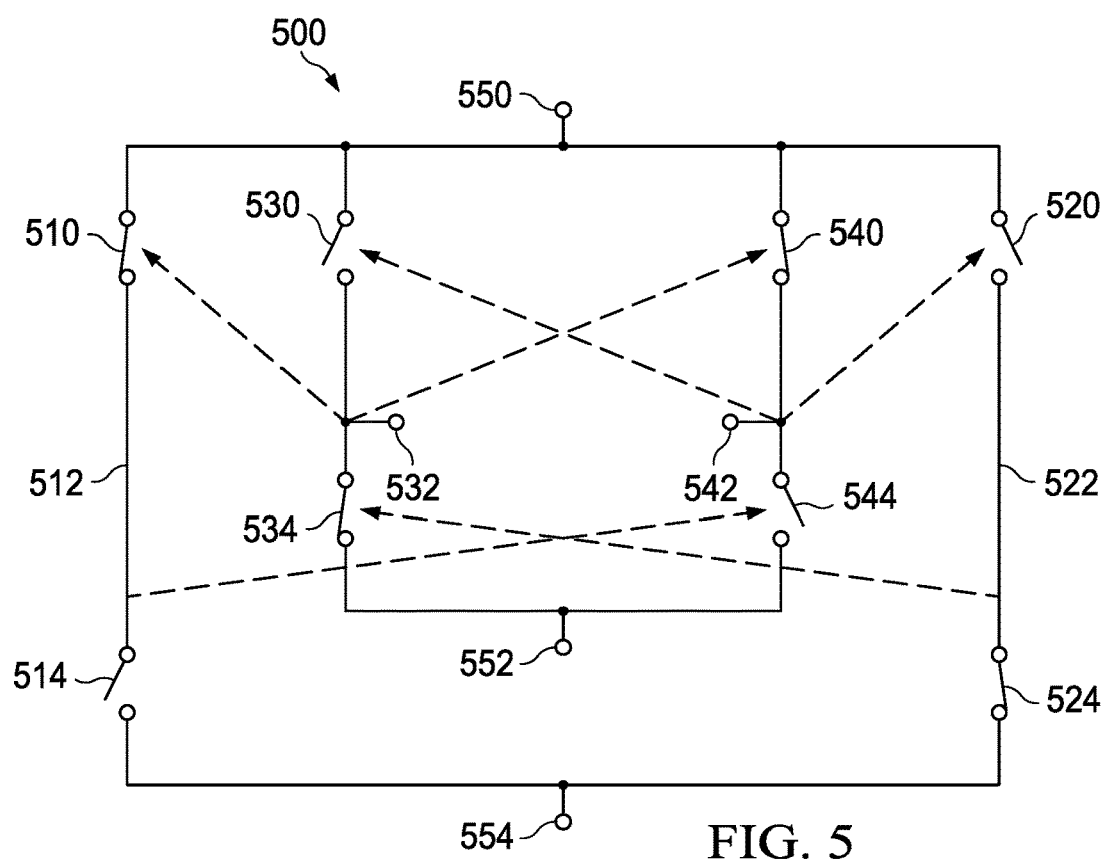

FIGS. 4 and 5 are circuit diagrams of level shifter circuits 400 and 500 in two different states according to some aspects of the present disclosure. In the example shown in FIG. 4, level shifter circuit 400 receives an input signal having a relatively high voltage at the control terminal of transistor 414 (e.g., 1.8 volts). In examples in which transistor 414 includes an NMOS transistor, the input signal can activate the conductive channel of transistor 414, thereby coupling node 412 to power supply node 454. The control terminal of transistor 424 receives an inverted version of the input signal, and the inverted signal has a relatively low voltage. In examples in which transistor 424 includes an NMOS transistor, the inverted signal can deactivate the conductive channel of transistor 424, thereby decoupling node 422 from power supply node 454.

In the example shown in FIG. 4, the voltage level at node 412 is pulled down towards the voltage level at power supply node 454 because the conductive channel of transistor 414 is active. The control terminal of transistor 444 is coupled to node 412. In examples in which transistor 444 includes a PMOS transistor, the voltage level at node 412 can activate the conductive channel of transistor 444, thereby coupling node 442 and power supply node 452. As a result, the voltage level at node 442 is pulled down towards the voltage level at power supply node 452 because the conductive channel of transistor 444 is active. The control terminals of transistors 420 and 430 are coupled to node 442. In examples in which each of transistors 420 and 430 includes a PMOS transistor, the voltage level at node 442 can activate the conductive channels of transistors 420 and 430, thereby coupling nodes 422 and 432 to power supply node 450. As a result, the voltage levels at nodes 422 and 432 are pulled up towards the voltage level at power supply node 450 because the conductive channels of transistors 420 and 430 are active.

When the voltage level at node 432 is pulled up in the example shown in FIG. 4, the voltage levels at the control terminals of transistors 410 and 440 are also pulled up. In examples in which each of transistors 410 and 440 includes a PMOS transistor, the voltage level at node 432 can deactivate the conductive channels of transistors 410 and 440, thereby decoupling nodes 412 and 442 from power supply node 450. Decoupling node 442 from power supply node 450 allows for transistor 444 to pull down the voltage level at node 442 towards the voltage level at power supply node 452. The voltage level at node 442, in turn, activates transistor 430 and starts pulling up node 432 towards the voltage level at supply node 450. As node 432 starts rising towards the voltage level at supply node 450, this voltage level deactivates transistor 440 and creates a positive feedback loop to maintain the voltage level at node 442 in response to the activation of transistor 444.

When the voltage level at node 422 is pulled up in the example shown in FIG. 4, the voltage levels at the control terminal of transistor 434 is also pulled up. In examples in which transistor 434 includes a PMOS transistor, the voltage level at node 422 can deactivate the conductive channel of transistor 434, thereby decoupling node 432 from power supply node 452. Decoupling node 432 from power supply node 452, along with pulling down of node 442 towards the voltage level at node 452, allows for transistor 430 to pull up the voltage level at node 432 towards the voltage level at power supply node 450. In this way, transistors 434, 410, 444, and 420 form another positive feedback which helps maintain the voltage level at node 432.

In the example shown in FIG. 5, level shifter circuit 500 receives an input signal having a relatively low voltage (e.g., zero volts) at the control terminal of transistor 514. In examples in which transistor 514 includes an NMOS transistor, the input signal can deactivate the conductive channel of transistor 514, thereby decoupling node 512 from power supply node 554. The control terminal of transistor 524 receives an inverted version of the input signal, and the inverted signal has a relatively high voltage. In examples in which transistor 524 includes an NMOS transistor, the inverted signal can activate the conductive channel of transistor 524, thereby coupling node 522 and power supply node 554.

In the example shown in FIG. 5, the voltage level at node 522 is pulled down towards the voltage level at power supply node 554 because the conductive channel of transistor 524 is active. The control terminal of transistor 534 is coupled to node 522. In examples in which transistor 534 includes a PMOS transistor, the voltage level at node 522 can activate the conductive channel of transistor 534, thereby coupling node 532 and power supply node 552. As a result, the voltage level at node 532 is pulled down towards the voltage level at power supply node 552 because the conductive channel of transistor 534 is active. The control terminals of transistors 510 and 540 are coupled to node 532. In examples in which each of transistors 510 and 540 includes a PMOS transistor, the voltage level at node 532 can activate the conductive channels of transistors 510 and 540, thereby coupling nodes 512 and 542 to power supply node 550. As a result, the voltage levels at nodes 512 and 542 are pulled up towards the voltage level at power supply node 550 because the conductive channels of transistors 510 and 540 are active.

When the voltage level at node 542 is pulled up in the example shown in FIG. 5, the voltage levels at the control terminals of transistors 520 and 530 are also pulled up. In examples in which each of transistors 520 and 530 includes a PMOS transistor, the voltage level at node 542 can deactivate the conductive channels of transistors 520 and 530, thereby decoupling nodes 522 and 532 from power supply node 550. Decoupling node 532 from power supply node 550 allows for transistor 534 to pull down the voltage level at node 532 towards the voltage level at power supply node 552. The voltage level at node 532, in turn, activates transistor 540 and starts pulling up node 542 towards the voltage level at supply node 550. As node 542 starts rising towards the voltage level at supply node 550, this voltage level deactivates transistor 540 and creates a positive feedback loop to maintain voltage level at node 532 in response to the activation of transistor 534.

When the voltage level at node 512 is pulled up in the example shown in FIG. 5, the voltage levels at the control terminal of transistor 544 is also pulled up. In examples in which transistor 544 includes a PMOS transistor, the voltage level at node 512 can deactivate the conductive channel of transistor 544, thereby decoupling node 542 from power supply node 552. Decoupling node 542 from power supply node 552, along with pulling down of node 532 towards the voltage level at node 552, allows for transistor 540 to pull up the voltage level at node 542 towards the voltage level at power supply node 550. In this way, transistors 534, 510, 544, and 520 form another positive feedback which helps maintain the voltage level at node 542.

Figure 6:
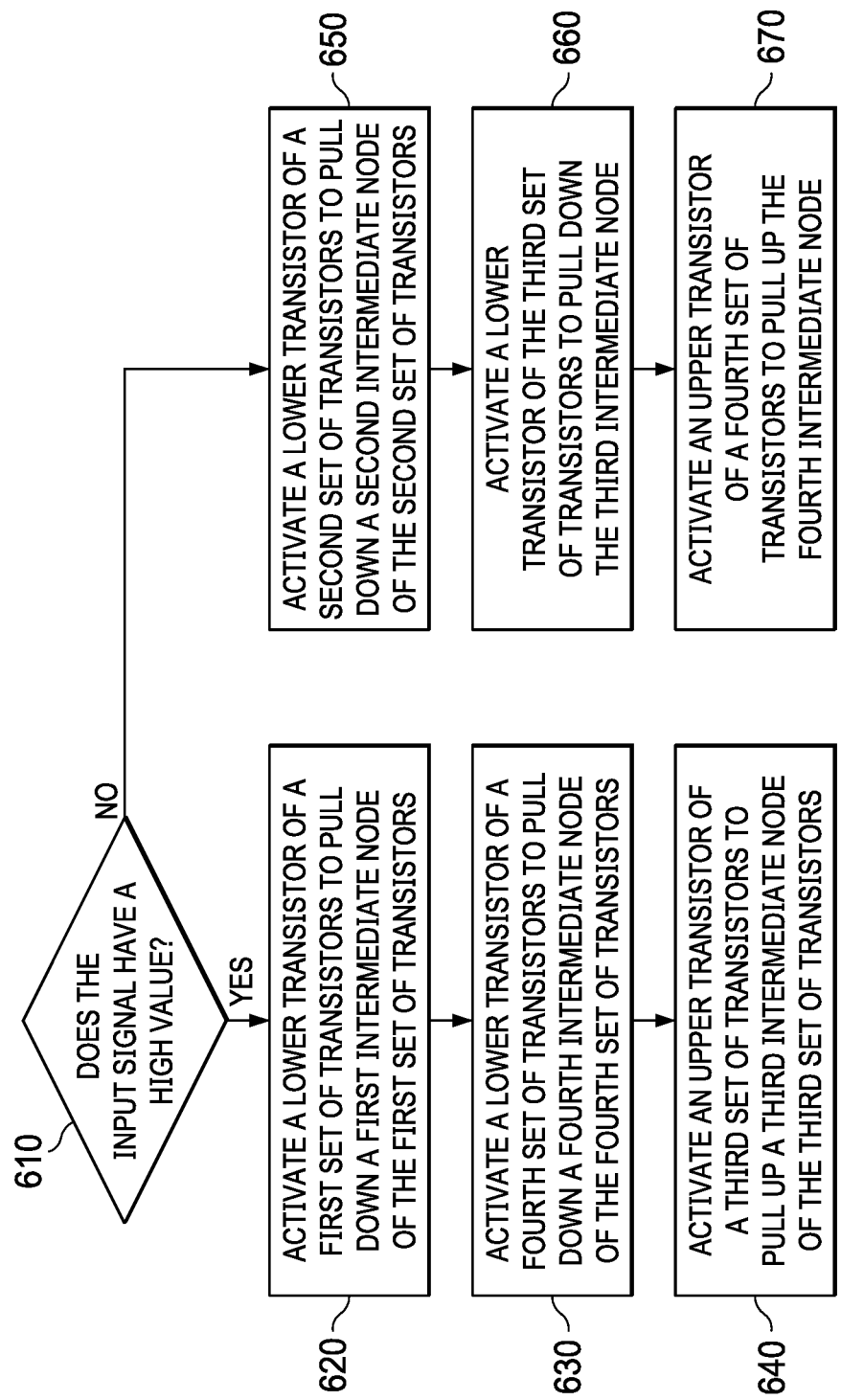
FIG. 6 is a flow diagram of a method for the operation of a level shifter circuit according to some aspects of the present disclosure.

FIG. 6 is a flow diagram of a method 600 for the operation of a level shifter circuit according to some aspects of the present disclosure. Some processes of the method 600 may be performed in orders other than described, and many processes may be performed concurrently in parallel. Furthermore, processes of the method 600 may be omitted or substituted in some examples of the present disclosure. The method 600 is described with reference to level shifter circuits 400 and 500 shown in FIGS. 4 and 5, although other entities or components may exemplify similar techniques.

Referring to block 610, level shifter circuits 400 and 500 receive an input signal at the control terminals of transistors 414, 424, 514, and 524. The input signal can have a voltage level that is associated with a logical value of one (e.g., a high value) or a logical value of zero (e.g., a low value). Referring to block 620, if the input signal has a high value, the conductive channel of transistor 414 becomes or remains activated and pulls down the voltage level at node 412. Node 412 is coupled to the control terminal of transistor 444 and to the conductive channels of transistors 410 and 414. If the input signal has a high value, the conductive channel of transistor 424 becomes or remains deactivated.

Referring to block 630, the pulled-down voltage level at node 412 activates the conductive channel of transistor 444 to pull down the voltage level at node 442. Node 442 is coupled to the control terminals of transistors 420 and 430 and to the conductive channels of transistors 440 and 444. Referring to block 640, the pulled-down voltage level at node 442 activates the conductive channel of transistor 430 to pull up the voltage level at node 432 to the voltage level at power supply node 450. Node 432 may be one of the output nodes of level shifter circuit 400. The pulled-down voltage level at node 442 can also activate the conductive channel of transistor 420 to pull up the voltage level at node 422 to the voltage level at power supply node 450.

Referring to block 650 and level shifter circuit 500 shown in FIG. 5, if the input signal has a low value, the conductive channel of transistor 524 becomes or remains activated and pulls down the voltage level at node 522. Node 522 is coupled to the control terminal of transistor 534 and to the conductive channels of transistors 520 and 524. If the input signal has a high value, the conductive channel of transistor 514 becomes or remains deactivated.

Referring to block 660, the pulled-down voltage level at node 522 activates the conductive channel of transistor 534 to pull down the voltage level at node 532. Node 532 is coupled to the control terminals of transistors 510 and 540 and to the conductive channels of transistors 530 and 534. Referring to block 670, the pulled-down voltage level at node 532 activates the conductive channel of transistor 540 to pull up the voltage level at node 542 to the voltage level at power supply node 550. Nodes 532 and 542 are the output nodes of level shifter circuit 500. The pulled-down voltage level at node 532 can also activate the conductive channel of transistor 510 to pull up the voltage level at node 512 to the voltage level at power supply node 550.

This disclosure has described level shifter circuits that may be capable of very fast operation. In some examples, a level shifter circuit of this disclosure includes two transistors configured as source followers that can respond quickly to changes in the voltage level at the input node of the level shifter circuit. The level shifter circuit may also include one or more positive feedback loops that allow for fast switching and for maintaining of the switched state at the output node of the level shifter circuit.

For a device made with advanced process nodes, the power supplies may have a voltage range of less than three volts, but three-volt capability may still be desirable, e.g., at one or more of the pins of the device. For example, at process nodes of 45 nanometers and smaller, the voltage range of the power supplies is typically 1.8 volts, and there may not be any native three-volt devices. A DEMOS transistor manufactured at 45 nanometers may support 3.6 volts at the drain terminal, but the gate-source voltage may be limited to 1.8 volts. However, despite this limitation of 1.8 volts, one or more of the analog modules of a microcontroller may be designed to support inputs and outputs at 3.3-volts. A level shifter circuit in the microcontroller may have to couple to a 3.3-volt supply rail and receive input signals at or below 1.8 volts. In addition, there may be speed requirements for the operation of the logic cells in the microcontroller, such that any level shifter circuit in the microcontroller needs to react quickly to changes in the voltage level at an input node of the level shifter circuit.

In accordance with the techniques of this disclosure, the level shifter circuits described in this disclosure may be configured to operate with dual supply rails, for example, of 1.8 volts and 3.3 volts. One or more of the nodes in the level shifter circuit (e.g., the first and second intermediate nodes) may be configured to swing between the lower reference voltage (e.g., zero volts) and the highest supply rails (e.g., 3.3 volts). For this reason, one or more of the transistors in the level shifter circuit may be implemented as a DEMOS transistor or another device with a higher voltage rating on one of the terminals. Additionally or alternatively, the level shifter circuit may include cascoded transistors to distribute the voltage stress. Other intermediate nodes in the level shifter circuit may be designed to experience a smaller voltage swings, such as 1.5 volts or 1.8 volts.

As compared to other level shifters, the level shifter circuits described herein may not have a biasing arm or a circuit for generating a bias supply voltage. In addition, the level shifter circuits described herein may have multiple positive feedbacks that impact or control both rise and fall transitions. For at least these reasons, the level shifter circuits described herein may operate more quickly and reliably than other level shifters.

The following numbered aspects demonstrate one or more aspects of the disclosure.

Aspect 1. A circuit includes an input node, a first power supply node, a second power supply node, a third power supply node, and a first set of transistors coupled between the first and second power supply nodes. The first set of transistors includes a first lower transistor including a control terminal coupled to the input node, and the first set of transistors further includes a first upper transistor. The circuit also includes a first intermediate node between the first upper transistor and the first lower switch, an inverter gate circuit, and a second set of transistors coupled between the first and second power supply nodes. The second set of transistors includes a second lower transistor including a control terminal coupled to the input node via the inverter gate circuit, and the second set of transistors further includes a second upper transistor. In addition, the circuit includes a second intermediate node between the second upper transistor and the second lower switch. The circuit further includes a third set of transistors coupled between the first and third power supply nodes. The third set of transistors includes a third lower transistor including a control terminal coupled to the second intermediate node, and the third set of transistors further includes a third upper transistor. The circuit also includes a third intermediate node between the third upper transistor and the third lower transistor. The circuit includes a fourth set of transistors coupled between the first and third power supply nodes, and the fourth set of transistors includes a fourth lower transistor including a control terminal coupled to the first intermediate node. The fourth set of transistors further includes a fourth upper transistor. The circuit further includes a fourth intermediate node between the fourth upper transistor and the fourth lower transistor.

Aspect 2. The circuit of the preceding aspect implemented as a level shifter.

Aspect 3. The circuit of the preceding aspects or any combination thereof, where the first upper transistor includes a control terminal coupled to the third intermediate node.

Aspect 4. The circuit of the preceding aspects or any combination thereof, where the first upper transistor includes a control terminal coupled to the third intermediate node.

Aspect 5. The circuit of the preceding aspects or any combination thereof, where the second upper transistor includes a control terminal coupled to the fourth intermediate node.

Aspect 6. The circuit of the preceding aspects or any combination thereof, where the third upper transistor includes a control terminal coupled to the fourth intermediate node.

Aspect 7. The circuit of the preceding aspects or any combination thereof, where the fourth upper transistor includes a control terminal coupled to the third intermediate node.

Aspect 8. The circuit of the preceding aspects or any combination thereof, where the third lower transistor further includes a source terminal coupled to the third intermediate node.

Aspect 9. The circuit of the preceding aspects or any combination thereof, where the fourth lower transistor further includes a source terminal coupled to the fourth intermediate node.

Aspect 10. The circuit of the preceding aspects or any combination thereof, further including a first output node coupled to the third intermediate node.

Aspect 11. The circuit of the preceding aspects or any combination thereof, further including a second output node coupled to the fourth intermediate node.

Aspect 12. The circuit of the preceding aspects or any combination thereof, where the third lower transistor includes a bulk terminal coupled to the third intermediate node.

Aspect 13. The circuit of the preceding aspects or any combination thereof, where the fourth lower transistor includes a bulk terminal coupled to the fourth intermediate node.

Aspect 14. The circuit of the preceding aspects or any combination thereof, where the third lower transistor comprises a first P-type transistor.

Aspect 15. The circuit of the preceding aspects or any combination thereof, where the fourth lower transistor comprises a second P-type transistor.

Aspect 16. The circuit of the preceding aspects or any combination thereof, where the first upper transistor comprises a third P-type transistor.

Aspect 17. The circuit of the preceding aspects or any combination thereof, where the second upper transistor comprises a fourth P-type transistor.

Aspect 18. The circuit of the preceding aspects or any combination thereof, where the third upper transistor comprises a fifth P-type transistor.

Aspect 19. The circuit of the preceding aspects or any combination thereof, where the fourth upper transistor comprises a sixth P-type transistor.

Aspect 20. The circuit of the preceding aspects or any combination thereof, where the first lower transistor comprises a first DEMOS transistor.

Aspect 21. The circuit of the preceding aspects or any combination thereof, where the second lower transistor comprises a second DEMOS transistor.

Aspect 22. The circuit of the preceding aspects or any combination thereof, where the third lower transistor comprises a third DEMOS transistor.

Aspect 23. The circuit of the preceding aspects or any combination thereof, where the fourth lower transistor comprises a fourth DEMOS transistor.

Aspect 24. The circuit of the preceding aspects or any combination thereof, where the first lower transistor comprises a first N-type transistor.

Aspect 25. The circuit of the preceding aspects or any combination thereof, where the second lower transistor comprises a second N-type transistor.

Aspect 26. The circuit of the preceding aspects or any combination thereof, where the third lower transistor includes a drain terminal coupled to the third power supply node.

Aspect 27. The circuit of the preceding aspects or any combination thereof, where the third upper transistor includes a source terminal coupled to the first power supply node.

Aspect 28. The circuit of the preceding aspects or any combination thereof, where the fourth lower transistor includes a drain terminal coupled to the third power supply node.

Aspect 29. The circuit of the preceding aspects or any combination thereof, where the fourth upper transistor includes a source terminal coupled to the first power supply node.

Aspect 30. The circuit of the preceding aspects or any combination thereof, where the first lower transistor includes a source terminal coupled to the second power supply node.

Aspect 31. The circuit of the preceding aspects or any combination thereof, where the first upper transistor includes a source terminal coupled to the first power supply node.

Aspect 32. The circuit of the preceding aspects or any combination thereof, where the second lower transistor includes a source terminal coupled to the second power supply node.

Aspect 33. The circuit of the preceding aspects or any combination thereof, where the second upper transistor includes a source terminal coupled to the first power supply node.

Aspect 34. A method includes activating a first lower transistor of a first set of transistors to pull down a voltage level at a first intermediate node of the first set of transistors responsive to receiving a first voltage signal at an input node of the level shift circuit. The method also includes activating a fourth lower transistor of a fourth set of transistors to pull down a voltage level at a fourth intermediate node of the fourth set of transistors responsive to the voltage level at the first intermediate node being pulled down. In addition, the method includes activating a third upper transistor of a third set of transistors to pull up a voltage level at a third intermediate node of the third set of transistors responsive to the voltage level at the fourth intermediate node being pulled down. The method further includes activating a second lower transistor of a second set of transistors to pull down a voltage level at a second intermediate node of the second set of transistors responsive to receiving a second voltage signal at the input node of the level shift circuit. The method includes activating a third lower transistor of the third set of transistors to pull down the voltage level at the third intermediate node responsive to the voltage level at the second intermediate node being pulled down. The method also includes activating a fourth upper transistor of the fourth set of transistors to pull up the voltage level at the fourth intermediate node responsive to the voltage level at the third intermediate node being pulled down.

Aspect 35. The method of the preceding aspect, further including deactivating the second lower switch responsive to receiving the first voltage signal at the input node of the level shift circuit.

Aspect 36. The method of aspect 34 or aspect 35, further including deactivating the first lower transistor responsive to receiving the second voltage signal at the input node of the level shift circuit.

Aspect 37. The method of aspects 34-36 or any combination thereof, further including deactivating a first upper transistor of the first set of transistors responsive to the voltage level at the third intermediate node being pulled up.

Aspect 38. The method of aspects 34-37 or any combination thereof, further including deactivating the fourth upper transistor responsive to the voltage level at the third intermediate node being pulled up.

Aspect 39. The method of aspects 34-38 or any combination thereof, further including activating a second upper transistor of the second set of transistors to pull up the voltage level at the second intermediate node responsive to the voltage level at the fourth intermediate node being pulled down.

Aspect 40. The method of aspects 34-39 or any combination thereof, further including deactivating the third upper transistor responsive to the voltage level at the second intermediate node being pulled up.

Aspect 41. The method of aspects 34-40 or any combination thereof, further including activating a first upper transistor of the first set of transistors to pull up the voltage level at the first intermediate node responsive to the voltage level at the third intermediate node being pulled down.

Aspect 42. The method of aspects 34-41 or any combination thereof, further including deactivating the fourth upper transistor responsive to the voltage level at the first intermediate node being pulled up.

Aspect 43. A level shifter circuit includes an input node, an inverter gate circuit, and a first transistor including a first control terminal and a first conductive channel, where the first control terminal is coupled to the input node. The level shifter circuit also includes a second transistor including a second control terminal and a second conductive channel, where the second control terminal is coupled to the input node via the inverter gate circuit. In addition, the level shifter circuit includes a third transistor including a third control terminal and a third conductive channel. The third conductive channel is coupled between the second conductive channel and a first power supply node, and the second conductive channel is coupled between the third conductive channel and a second power supply node. The level shifter circuit further includes a fourth transistor including a fourth control terminal and a fourth conductive channel. The fourth conductive channel is coupled between the first conductive channel and the first power supply node, and the first conductive channel is coupled between the fourth conductive channel and the second power supply node. The level shifter circuit further includes a fifth transistor including a fifth control terminal and a fifth conductive channel. The fifth control terminal is coupled to the third control terminal, and the fifth conductive channel is coupled between the fourth control terminal and the first power supply node. The level shifter circuit also includes a sixth transistor including a sixth control terminal and a sixth conductive channel. The sixth control terminal is coupled to the fourth control terminal, and the sixth conductive channel is coupled between the third control terminal and the first power supply node. The level shifter circuit includes a seventh transistor including a seventh control terminal and a seventh conductive channel. The seventh control terminal is coupled to the second conductive channel and the third conductive channel, and the seventh conductive channel is coupled between the fifth conductive channel and a third power supply node. The level shifter circuit further includes an eighth transistor including an eighth control terminal and an eighth conductive channel, wherein the eighth control terminal is coupled to the first conductive channel and the fourth conductive channel, and wherein the eighth conductive channel is coupled between the sixth conductive channel and the third power supply node.

Aspect 44. The level shifter circuit of the preceding aspect, where the seventh transistor includes a source terminal coupled to the fifth conductive channel.

Aspect 45. The level shifter circuit of aspect 43 or aspect 44, where the eighth transistor includes a source terminal coupled to the sixth conductive channel.

Aspect 46. The level shifter circuit of aspect 43-45 or any combination thereof, where the seventh transistor includes a bulk terminal coupled to the fifth conductive channel.

Aspect 47. The level shifter circuit of aspect 43-46 or any combination thereof, where the eighth transistor includes a bulk terminal coupled to the sixth conductive channel.

Aspect 48. The level shifter circuit of aspect 43-47 or any combination thereof, where the seventh transistor comprises a first P-type transistor.

Aspect 49. The level shifter circuit of aspect 43-48 or any combination thereof, where the eighth transistor comprises a second P-type transistor.

Aspect 50. The level shifter circuit of aspect 43-49 or any combination thereof, where the third transistor comprises a third P-type transistor.

Aspect 51. The level shifter circuit of aspect 43-50 or any combination thereof, where the fourth transistor comprises a fourth P-type transistor.

Aspect 52. The level shifter circuit of aspect 43-51 or any combination thereof, where the fifth transistor comprises a fifth P-type transistor.

Aspect 53. The level shifter circuit of aspect 43-52 or any combination thereof, where the sixth transistor comprises a sixth P-type transistor.

Aspect 54. The level shifter circuit of aspect 43-53 or any combination thereof, where the first transistor comprises a first DEMOS transistor.

Aspect 55. The level shifter circuit of aspect 43-54 or any combination thereof, where the second transistor comprises a second DEMOS transistor.

Aspect 56. The level shifter circuit of aspect 43-55 or any combination thereof, where the third transistor comprises a third DEMOS transistor.

Aspect 57. The level shifter circuit of aspect 43-56 or any combination thereof, where the fourth transistor comprises a fourth DEMOS transistor.

Aspect 58. The level shifter circuit of aspect 43-57 or any combination thereof, where the first transistor comprises a first N-type transistor.

Aspect 59. The level shifter circuit of aspect 43-58 or any combination thereof, where the second transistor comprises a second N-type transistor.

This disclosure has attributed functionality to control circuit 140. Control circuit 140 may include one or more processors. Control circuit 140 may include any combination of integrated circuitry, discrete logic circuity, analog circuitry, such as one or more microprocessors, microcontrollers, DSPs, application specific integrated circuits (ASICs), central processing units (CPUs), graphics processing units (GPUs), FPGAs, and/or any other processing resources. In some examples, control circuit 140 may include multiple components, such as any combination of the processing resources listed above, as well as other discrete or integrated logic circuitry, and/or analog circuitry.

The techniques described in this disclosure may also be embodied or encoded in an article of manufacture including a non-transitory computer-readable storage medium. Example non-transitory computer-readable storage media may include random access memory (RAM), read-only memory (ROM), programmable ROM (PROM), erasable programmable ROM (EPROM), electronically erasable programmable ROM (EEPROM), flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

It is understood that the present disclosure provides a number of exemplary embodiments and that modification are possible to these embodiments. Such modifications are expressly within the scope of this disclosure. Furthermore, application of these teachings to other environments, applications, and/or purposes is consistent with and contemplated by the present disclosure.

What is claimed is:
1. A level shifter circuit comprising:
 a first set of transistors including a first lower transistor and a first upper transistor;
 a first intermediate node between the first upper transistor and the first lower transistor;
 a second set of transistors including a second lower transistor and a second upper transistor;
 a second intermediate node between the second upper transistor and the second lower transistor;
 a third set of transistors including a third lower transistor including a control terminal coupled to the second intermediate node, wherein the third set of transistors further includes a third upper transistor;
 a third intermediate node between the third upper transistor and the third lower transistor, wherein the first upper transistor includes a control terminal coupled to the third intermediate node;
 a fourth set of transistors including a fourth lower transistor including a control terminal coupled to the first intermediate node, wherein the fourth set of transistors further includes a fourth upper transistor including a control terminal coupled to the third intermediate node; and
 a fourth intermediate node between the fourth upper transistor and the fourth lower transistor,
 wherein the second upper transistor includes a control terminal coupled to the fourth intermediate node, and
 wherein the third upper transistor includes a control terminal coupled to the fourth intermediate node.

2. The level shifter circuit of claim 1,
 wherein the third lower transistor further includes a source terminal coupled to the third intermediate node, wherein the fourth lower transistor further includes a source terminal coupled to the fourth intermediate node.

3. The level shifter circuit of claim 1, further comprising:
a first output node coupled to the third intermediate node; and
a second output node coupled to the fourth intermediate node.

4. The level shifter circuit of claim 1,
wherein the third lower transistor includes a bulk terminal coupled to the third intermediate node, and
wherein the fourth lower transistor includes a bulk terminal coupled to the fourth intermediate node.

5. The level shifter circuit of claim 1,
wherein the third lower transistor comprises a first P-type transistor, and
wherein the fourth lower transistor comprises a second P-type transistor.

6. The level shifter circuit of claim 1,
wherein the first lower transistor comprises a first drain-extended metal-oxide-semiconductor (DEMOS) transistor, and
wherein the second lower transistor comprises a second DEMOS transistor.

7. The level shifter circuit of claim 6,
wherein the first upper transistor comprises a third DEMOS transistor, and
wherein the second upper transistor comprises a fourth DEMOS transistor.

8. The level shifter circuit of claim 1,
wherein the first lower transistor comprises a first N-type transistor, and
wherein the second lower transistor comprises a second N-type transistor.

9. The level shifter circuit of claim 1, further comprising a first power supply node, a second power supply node, and a third power supply node,
wherein the third lower transistor includes a drain terminal coupled to the third power supply node,
wherein the third upper transistor includes a source terminal coupled to the first power supply node,
wherein the fourth lower transistor includes a drain terminal coupled to the third power supply node, and
wherein the fourth upper transistor includes a source terminal coupled to the first power supply node.

10. The level shifter circuit of claim 9,
wherein the first lower transistor includes a source terminal coupled to the second power supply node,
wherein the first upper transistor includes a source terminal coupled to the first power supply node,
wherein the second lower transistor includes a source terminal coupled to the second power supply node, and
wherein the second upper transistor includes a source terminal coupled to the first power supply node.

11. A system comprising:
a low-side power transistor including a control terminal;
a high-side power transistor including a control terminal;
a control circuit including an output coupled to the control terminal of the low-side power transistor; and
the level shifter circuit of claim 1, wherein the level shift circuit is coupled between the output of the control circuit and the control terminal of the high-side power transistor.

12. The system of claim 11,
wherein the first upper transistor comprises a first drain-extended metal-oxide-semiconductor (DEMOS) transistor, and wherein the second upper transistor comprises a second DEMOS transistor,
wherein the first lower transistor comprises a third DEMOS transistor, and
wherein the second lower transistor comprises a fourth DEMOS transistor.

13. The system of claim 11,
wherein the level shifter circuit is a first level shifter circuit,
wherein the system further comprises a second level shifter circuit coupled between the output of the control circuit and the control terminal of the low-side power transistor, and
wherein the second level shifter circuit is coupled between the output of the control circuit and the first level shifter circuit.

14. A level shifter circuit comprising:
a first transistor including a first conductive channel;
a second transistor including a second conductive channel;
a third transistor including a third control terminal and a third conductive channel, wherein the third conductive channel is coupled to the second conductive channel;
a fourth transistor including a fourth control terminal and a fourth conductive channel, wherein the fourth conductive channel is coupled to the first conductive channel;
a fifth transistor including a fifth control terminal and a fifth conductive channel, wherein the fifth control terminal is coupled to the third control terminal, and wherein the fifth conductive channel is coupled to the fourth control terminal;
a sixth transistor including a sixth control terminal and a sixth conductive channel, wherein the sixth control terminal is coupled to the fourth control terminal, and wherein the sixth conductive channel is coupled to the third control terminal;
a seventh transistor including a seventh control terminal and a seventh conductive channel, wherein the seventh control terminal is coupled to the second conductive channel and the third conductive channel, and wherein the seventh conductive channel is coupled to the fifth conductive channel; and
an eighth transistor including an eighth control terminal and an eighth conductive channel, wherein the eighth control terminal is coupled to the first conductive channel and the fourth conductive channel, and wherein the eighth conductive channel is coupled to the sixth conductive channel.

15. The level shifter circuit of claim 14,
wherein the seventh transistor includes a source terminal coupled to the fifth conductive channel, and
wherein the eighth transistor includes a source terminal coupled to the sixth conductive channel.

16. The level shifter circuit of claim 15,
wherein the first transistor comprises a first N-type transistor, and
wherein the second transistor comprises a second N-type transistor.

17. The level shifter circuit of claim 14,
wherein the seventh transistor includes a bulk terminal coupled to the fifth conductive channel, and
wherein the eighth transistor includes a bulk terminal coupled to the sixth conductive channel.

18. The level shifter circuit of claim 14,
wherein the seventh transistor comprises a first P-type transistor, and wherein the eighth transistor comprises a second P-type transistor.

19. The level shifter circuit of claim 14,
wherein the first transistor comprises a first drain-extended metal-oxide-semiconductor (DEMOS) transistor, and
wherein the second transistor comprises a second DEMOS transistor.

20. The level shifter circuit of claim 19,
wherein the third transistor comprises a third DEMOS transistor, and
wherein the fourth transistor comprises a fourth DEMOS transistor.

* * * * *